United States Patent [19]

Ishikawa et al.

[11] Patent Number: 5,223,740
[45] Date of Patent: Jun. 29, 1993

[54] PLASTIC MOLD TYPE SEMICONDUCTOR DEVICE

[75] Inventors: Toshimitsu Ishikawa, Kawaguchi; Kazuichi Komenaka, Kawasaki, both of Japan

[73] Assignee: Kawasaki Kaisha Toshiba, Kawasaki, Japan

[21] Appl. No.: 692,893

[22] Filed: Apr. 29, 1991

[30] Foreign Application Priority Data

Apr. 27, 1990 [JP] Japan .................. 2-112715
Nov. 27, 1990 [JP] Japan .................. 2-324332

[51] Int. Cl.⁵ ............................. H01L 23/48
[52] U.S. Cl. ........................ 257/676; 257/666
[58] Field of Search ............ 357/70, 72; 257/666, 257/676, 787

[56] References Cited

U.S. PATENT DOCUMENTS

| 4,595,945 | 6/1986 | Graver | 357/70 |
| 4,612,564 | 9/1986 | Moyer | 357/70 |
| 4,937,656 | 6/1990 | Kohara | 357/72 |
| 5,089,879 | 2/1992 | Komenaka | 357/70 |

FOREIGN PATENT DOCUMENTS 59-27558  2/1984  Japan ...................... 357/70
3-48454   3/1991  Japan ...................... 357/70

OTHER PUBLICATIONS

Ward, "Volume Production of Unique Plastic Surface-Mount Modules for the IBM 80-ns 1Mbit DRAM chip by Area Wire Bond Techniques," 1988, pp. 552-557.

Primary Examiner—Andrew J. James
Assistant Examiner—Courtney A. Bowers
Attorney, Agent, or Firm—Foley & Lardner

[57] ABSTRACT

A plastic mold semiconductor device comprises a semiconductor chip; a die pad which is made of a thin metallic plate for supporting the semiconductor chip; leads which surround the die pad, wires for connecting electrodes on top of the semiconductor chip and the leads; and plastic mold for sealing the entire device; the die pad being comprised of support sections separated by a fixed gap from a sub-element interconnecting member which is insulated from the semiconductor chip, and connection between the power source or signal related lead and the electrode which is on top the semiconductor chip and is located from the power source or signal related lead is connected by the sub-element interconnecting member.

2 Claims, 11 Drawing Sheets

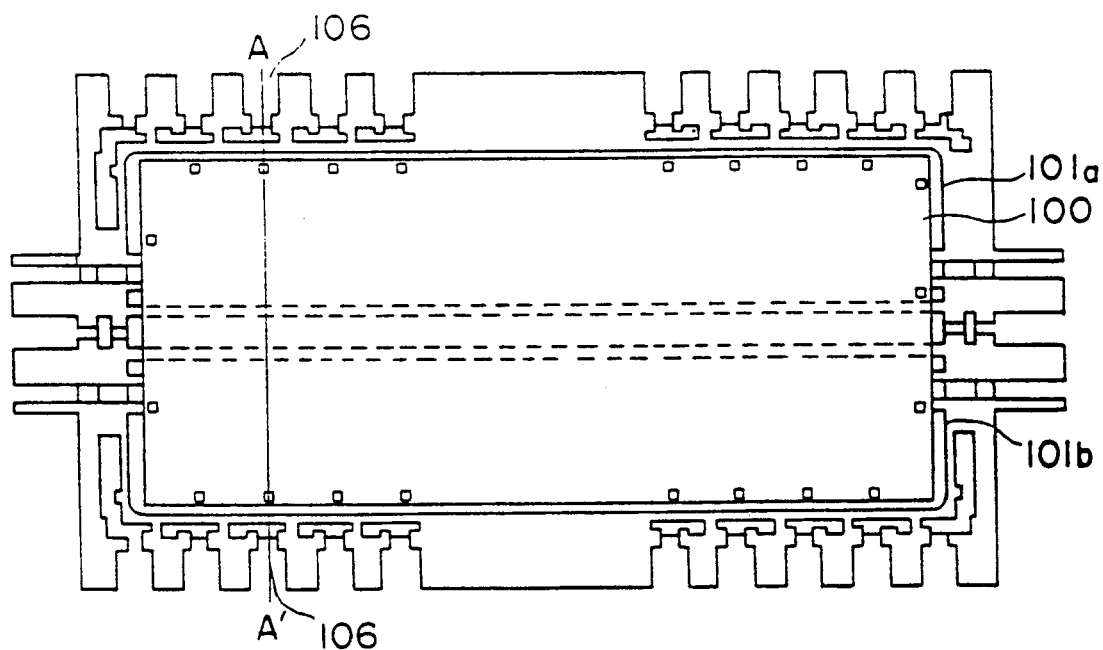
F I G. 4
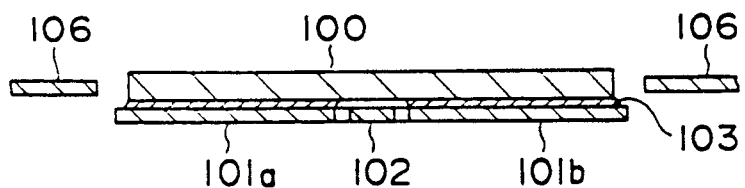
F I G. 5A
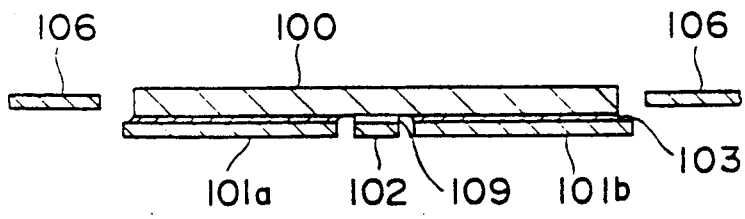
F I G. 5B
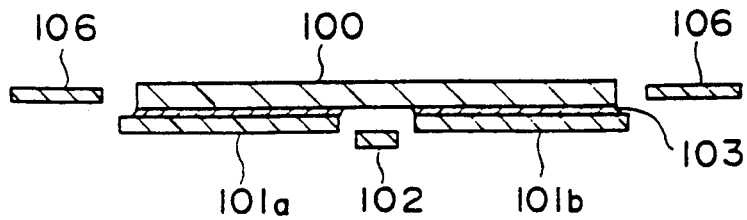
F I G. 5C

PLASTIC MOLD TYPE SEMICONDUCTOR DEVICE

BACKGROUND OF THE INVENTION

This invention relates to a plastic mold type semiconductor device.

FIG. 16 is a plan view of an example of the generally known prior plastic mold type semiconductor device. It is the lead frame for an SOJ (Small Outline J-Lead Package) type semiconductor device. FIG. 17 is a plan view showing the semiconductor elements of the lead frame of FIG. 16. FIG. 18 is a sectional view showing section E-E' of FIG. 13.

In the center of this kind of lead frame is a die pad 2, and surrounding it are leads 3 for sending and receiving signals and voltage potential. The outer-frame will be omitted in the drawings of the lead frame below.

Bonding of the leads 3, as will be mentioned later, is done with wire; however to improve the characteristics of this bonding and also to improve the reliability of the connection, the lead ends 3a are plated with silver or gold. Also, in order to increase the current capacity, the lead end in the corner used for supplying power is made larger than the other lead ends.

In referring to FIG. 17 and FIG. 18, the semiconductor chip 1 is bonded to the top of the die pad 2 using die mount material 4. The bonding pads 9 of this semiconductor chip 1 are connected to the lead ends 3a with highly conductive thin metal wires 5 such as gold or aluminum. After wire bonding is completed, in order to protect the chip from the outside environment and to protect it from external forces and impact, a plastic mold 8 is formed around the entire chip. The portion of the leads that are covered with the plastic mold are called the inner-leads 6 and the portion of the leads outside of the plastic mold are called the outer-leads 7.

As shown in FIG. 18, the outer leads 7 are cut and separated from the outer-frame of the lead frame and then bent to form a J-shape.

In recent years, due to highly functional semiconductor devices, there is a tendency to increase the semiconductor chip size; however it becomes very difficult to place the enlarged semiconductor chip into a specified sized package.

For this reason, it is desired to reduce the size of the semiconductor chip itself; and so does the design rule itself.

However, in following this size reduced design rule, the wiring inside of the semiconductor chip must be made very thin, which increases the wire resistance. When the wire resistance increases, especially in the case of power supply or signal related wiring, external noise is picked up, making it easy for noise to be transmitted with the signal. Taking this into consideration, in trying to avoid the effects of noise it becomes difficult to increase the operating speed. Generally, power supply or signal related wiring takes up a large portion of the semiconductor chip area, and so the area of the wiring related to the power supply or signal must be reduced even though the above problems exist.

In order to do so, the following prior semiconductor devices have been proposed.

One of these is shown in FIG. 19, where the wiring capacity is increased by putting bonding pads, used to supply the potential, on top of the semiconductor chip 11 at both ends (20 and 21). In doing so, the wire resistance as well as the noise is reduced, thus making it possible to increase the operating speed.

However, in this semiconductor device, a new problem is created in that the wiring must be wired over a long distance. This is explained using the drawings.

In FIG. 19 and in FIG. 20 which is an illustrative drawing of FIG. 19, if the voltage potential or signal source (ground having 0 V potential) X is located in the upper left, the bonding pad 20 is very close to it and so connecting the bonding wire to the power supply or signal lead 30 is very simple to do; however because bonding pad 21 is so far away, it is necessary to run the wire halfway around the semiconductor chip 11. However, this is impossible in the construction of the device shown in FIG. 15.

In order to solve this problem, three-dimensional wiring is necessary. This is shown in FIG. 21 and FIG. 22 which is F-F' sectional view of FIG. 21.

In this construction, insulating adhesive 22 is used as the die mount material to bond the semiconductor chip 11 to the die pad 12. The potential supply or signal lead 31 is connected to a tie bar 32, and a bonding pad 23 is located on the die pad in the vicinity of another bonding pad 21 and the two are connected with a bonding wire 5. Also, a section of the die pad 12 is used as part of the wiring, and as shown in the section of FIG. 22 and the film diagram of FIG. 23, the wiring has become three-dimensional increasing the current supply or signal quantity.

However, in construction of this kind, because the semiconductor chip 11 and the die pad 12 are insulated by the insulating adhesive 22, it is necessary to control the thickness of the insulating adhesive. In other words, if the thickness of the insulating adhesive is very thin, there is the fear that the semiconductor chip 11 and the die pad 12 will directly short-circuited. Also if the film is thin, air voids exist and if moisture makes its way into one of these from outside, current leaks between the semiconductor chip 11 and the die pad 12 occur and the yield and reliability of the device are remarkably deteriorated. Therefore, it is necessary in order to maintain insulation, that the thickness of the thin film be a set thickness or more; however the manufacturing process for doing this is very complicated and difficult.

SUMMARY OF THE INVENTION

The object of this invention is to provide a plastic mold type semiconductor device with low wire resistance and miniaturized and which does not require complicated manufacturing control.

According to the present invention, there is provided a plastic mold semiconductor device comprising: a semiconductor chip; a die pad which is made of a thin metallic plate for supporting said semiconductor chip; leads which surround said die pad, wires for connecting electrodes on top of said semiconductor chip and said leads; and plastic mold for sealing the entire device; said die pad being comprised of support members separated by a fixed gap from a sub-element interconnecting member which is insulated from the semiconductor chip, and connection between the power source related lead of said leads and said electrode which is on top of the said semiconductor device and is located from the power source related lead being performed by said sub-element interconnecting member.

The plastic mold type semiconductor device of this invention divides up the die pad used in prior devices; and in one of these divisions the semiconductor chip is supported, and in the other division is the interconnecting member which supplies the potential to the semiconductor chip which is separated from the potential or signal source. This makes it simple to run the three-dimensional wiring. In order to obtain this kind of construction, it is sufficient not to apply the adhesive on the sub-element interconnecting member and therefore complicated manufacturing control is not needed.

An insulator is located between the sub-element interconnecting member and the semiconductor chip, or when the sub-element interconnecting member is depressed more than the support member, the molding plastic—which is an insulator - fills in between the sub-element wiring member and the semiconductor chip and can insulate both of them.

Also if the sub-element interconnecting section is thinner than the support sections and the bottom surfaces of both are level, the molding plastic can be filled in between the sub-element interconnecting member and the semiconductor chip making it possible to reduce the thickness of the semiconductor device.

BRIEF DESCRIPTION OF THE DRAWINGS

The accompanying drawings are as follows:

FIG. 4 is a plan view showing the lead frame of FIG. 2 with the semiconductor chip now in place;

FIG. 5A thru 5C are sectional views showing section A-A' of FIG. 4;

DESCRIPTION OF THE PREFERRED EMBODIMENTS

Detailed explanations of the preferred embodiments of this invention will be given below using the above drawings.

Figure 1A:
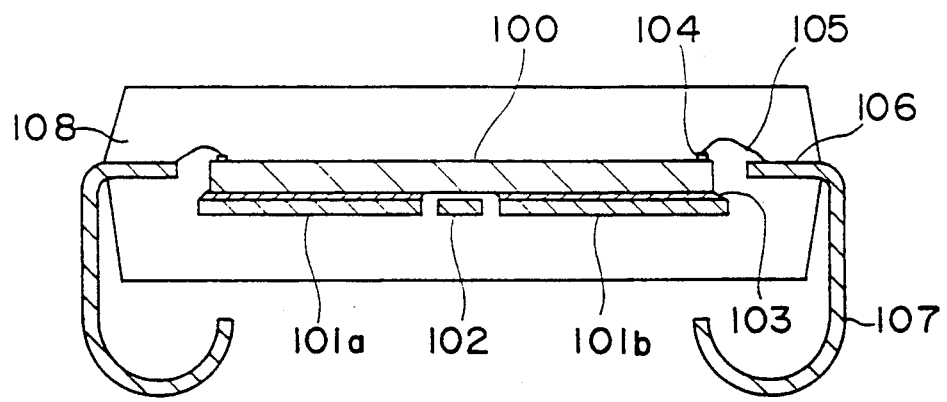
FIGS. 1A thru 1C are sectional views of three embodiments of the semiconductor device of this invention.
Figure 1B:
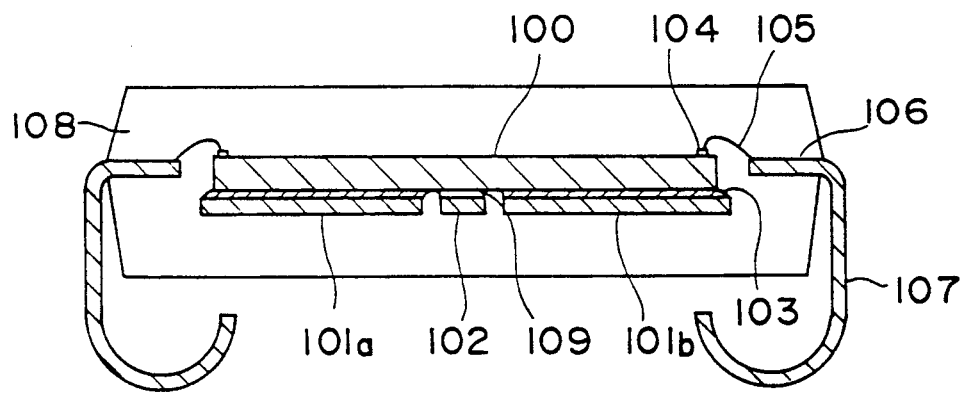
Figure 1C:
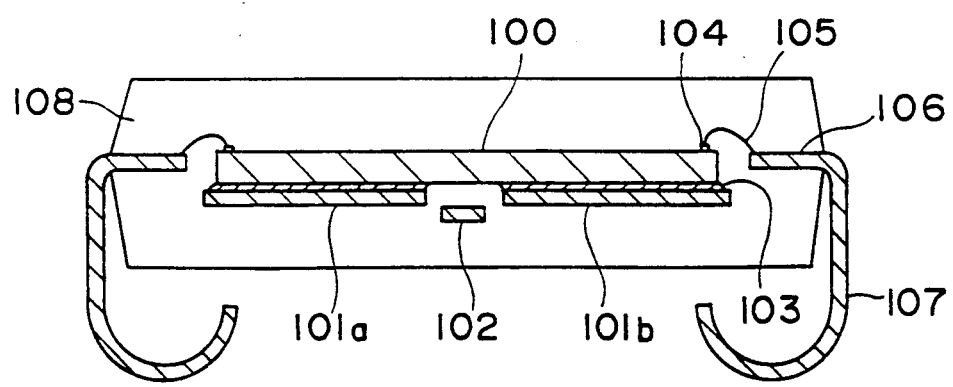

FIGS. 1A thru 1C are sectional views of three embodiments of the semiconductor device of this invention and show an SOJ-type plastic mold semiconductor device. They are of section A-A' of FIG. 6 and are each a different embodiment of this invention.

In this semiconductor device the die pad is divided up into three sections; two support sections 101 and in between these, having a fixed gap, is the sub-element lead 102. The semiconductor chip 100 is adhered to the top of the support sections 101 by the die mount material 103 and is supported by it. The leads 106 are located around the support sections 101 and are connected to bonding pads 104 on top of the semiconductor chip 100 by bonding wires 105. To protect the device from moisture and impact, plastic mold 108 is formed around the entire device. The outer leads 107 are the same as in prior devices; they are cut and bent to form a J-shape.

In FIG. 1A, the die mount material 103 is not applied to the top surface of the sub-element lead 102. Therefore, the top surface of the sub-element lead 102 and the bottom surface of the semiconductor chip 100 are separated by a distance equal to the thickness of the die mount material and they are insulated by forcing molding plastic—which is an insulator—in between them.

In FIG. 1B, in order to insulate the top surface of the sub-element lead 102 and the bottom surface of the semiconductor chip 100, an insulating plastic or resin is applied to the top surface of the sub-element lead 102, and this insulating material is put between them.

In FIG. 1C, the sub-element lead 102 is depressed more than the support sections 101. The reliability of the wire bonding improves when the top surface of the semiconductor chip and the inner lead are at the same level and so the support sections are only depressed the thickness of the semiconductor chip; however in this embodiment, because the insulation characteristics improve when the distance between the top surface of the sub-element lead 102 and the semiconductor chip 100 is increased, the sub-element lead 102 is depressed more than the support sections 101.

Figure 2:
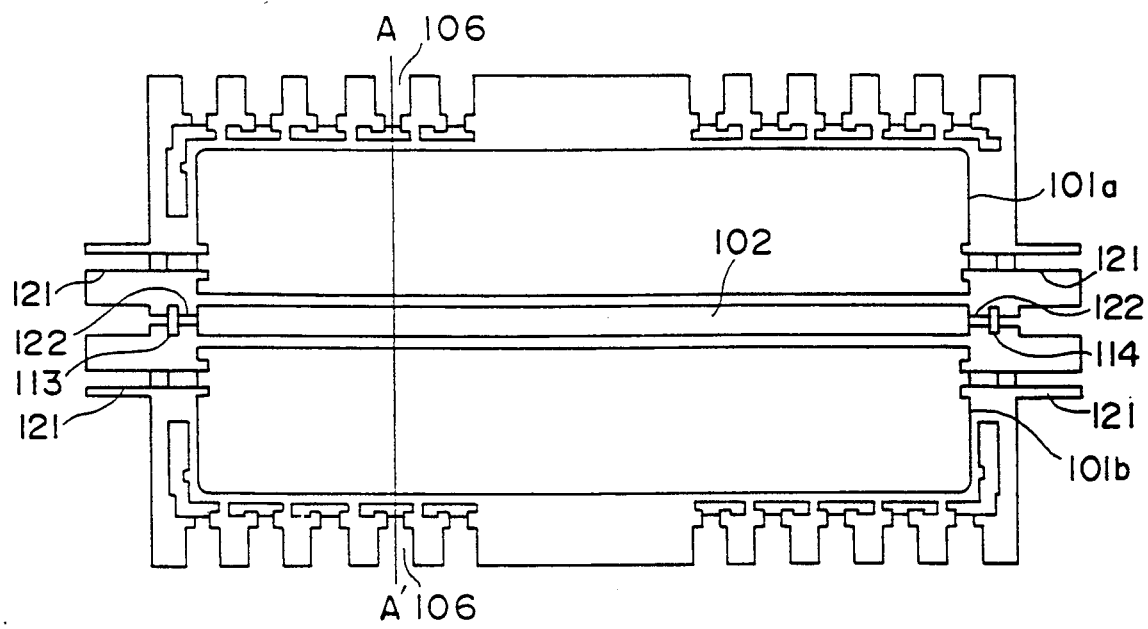
FIG. 2 is a plan view showing the lead frame used in the semiconductor device of this invention.
Figure 3A:
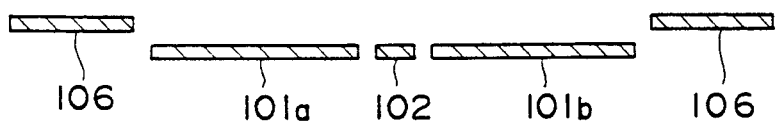
FIGS. 3A thru 3C are sectional views of the lead frame construction corresponding to the embodiments shown in FIGS. 1A thru 1C.
Figure 3B:
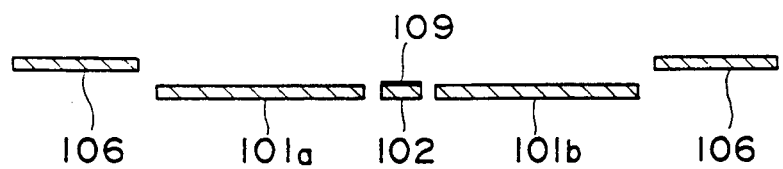
Figure 3C:
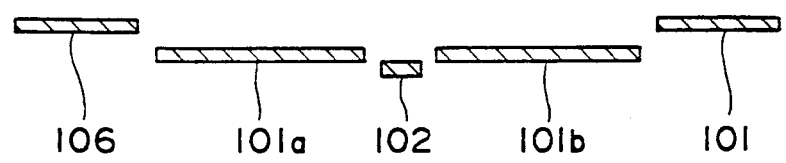

FIG. 2 is a plan view of the lead frame used in this invention, and FIGS. 3A, 3B, and 3C are sectional views showing section A-A' of FIG. 2 and show the lead frame construction corresponding to FIGS. 1A, 1B, and 1C.

As can be seen in FIG. 2, the die pad used in prior devices has been divided into 3 sections; two support sections 101 to support the semiconductor chip and placed in between them having a fixed gap is the sub-element lead 102. The support sections 101 are connected to the outer-frame (not shown in the drawings) of the lead frame by a tie bar 121, and the sub-element lead 102 is connected to the outer-frame of the lead frame by another tie bar 122.

In FIG. 3A, the support sections 101 and the sub-element lead 102 are depressed the same amount, in FIG. 3B, the aforementioned insulating plastic or resin is applied to the top surface of the sub-element lead 102, and in FIG. 3C the sub-element lead 102 is depressed more than the support sections 101. These are as was explained above for FIG. 1. For insulating the surface of the sub-element lead 102 an insulating sheet such as a polymide sheet can also be applied.

Using FIG. 4 thru FIG. 6, the manufacturing process of the semiconductor device of this invention using this lead frame will be explained.

In FIG. 4, the die mount material has been applied to the support sections 101 and the semiconductor chip 100 has been bonded to the support sections. The die mount material is not applied to the sub-element lead 102. This die mount material used is a conductive material when the substrate of the semiconductor chip and the support sections are to have the same voltage potential, and is made of an insulating material when this is not the case. The die mount materials known to be usable are epoxy type resins, solder, and silicon resins. FIGS. 5A, 5B, and 5C are sectional views showing section A-A' of FIG. 4, and correspond to each of the embodiments of FIGS. 1A thru 1C. In FIG. 5A, the top surface of the sub-element lead 102 and the bottom surface of the semiconductor chip are separated by a gap equal to the thickness of the die mount material. Due to the existence of this gap, when the plastic mold is made, the mold material is forced into the gap completely insulating both of them.

In FIG. 5B, an insulating material 109 is applied to the top surface of the sub-element lead 102 insulating it even if the vertical position of the sub-element lead 102 changes. In FIG. 5C, because the sub-element lead 102 is depressed more than the support sections 101 the operation of the lead is good and can be insulated for sure.

Figure 6:
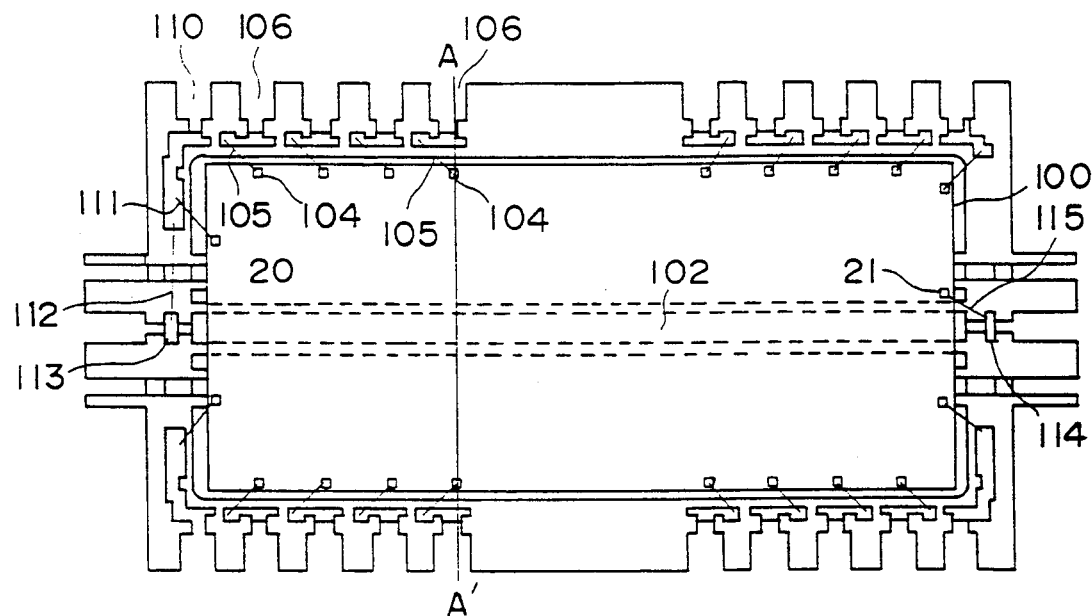
FIG. 6 shows the wire bonding.
Figure 7:
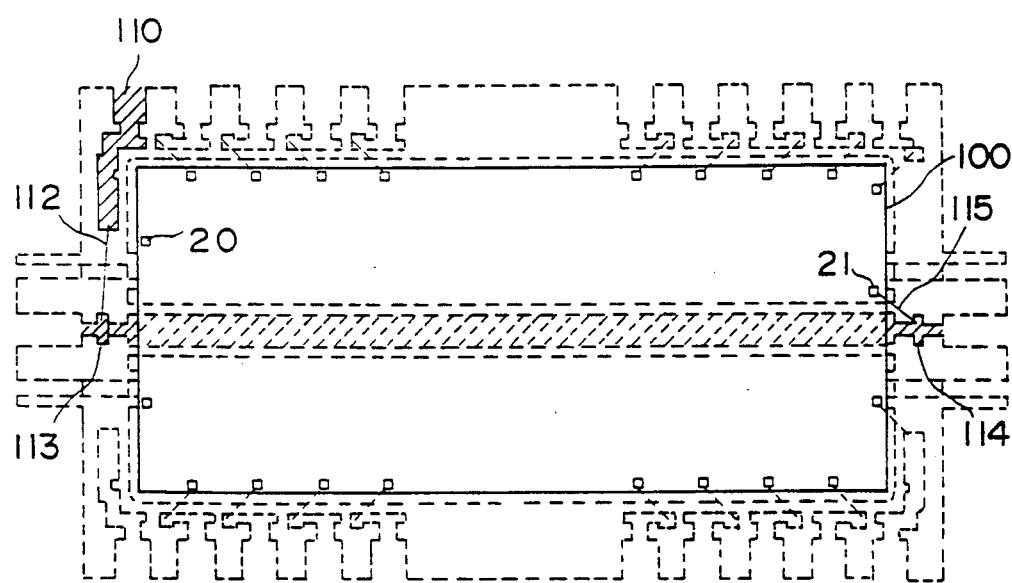
FIG. 7 emphasizes the power supply or signal connections of FIG. 6.
Figure 8:
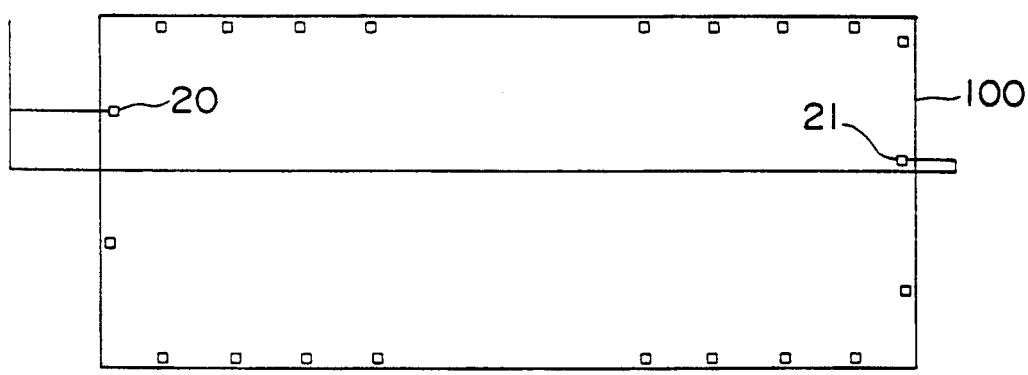
FIG. 8 shows the film of FIG. 6 with the power supply or signal connections.

FIG. 6, is a plan view showing the wire bonding after the manufacturing process shown in FIG. 4. As in the explanation of FIG. 1, the electrodes 104 on top of the semiconductor chip are connected to the leads 106 by bonding wires 105; however the lead 110 which supplies the voltage potential or signal is connected to a nearby electrode 20 by a bonding wire 105 as well as being connected to a bonding pad 113 on part of the sub-element lead 102 by another bonding wire 112. Also, the pad 114 on the extension of the sub-element lead 102 is connected to the electrode 21 on top of the semiconductor chip 100 by a bonding wire 115. This is emphasized in FIG. 7. FIG. 8 shows how the voltage potential is supplied from the voltage potential supply lead and runs underneath the semiconductor chip to the separated electrode 21. It can be seen that by running a lead underneath the semiconductor chip that the voltage potential or signal can be supplied from the voltage potential supply or signal lead to the separated electrode. After this, as was done in prior devices, the plastic mold is formed and the outer leads are cut and bent to obtain the construction shown in FIG. 1.

Figure 9:
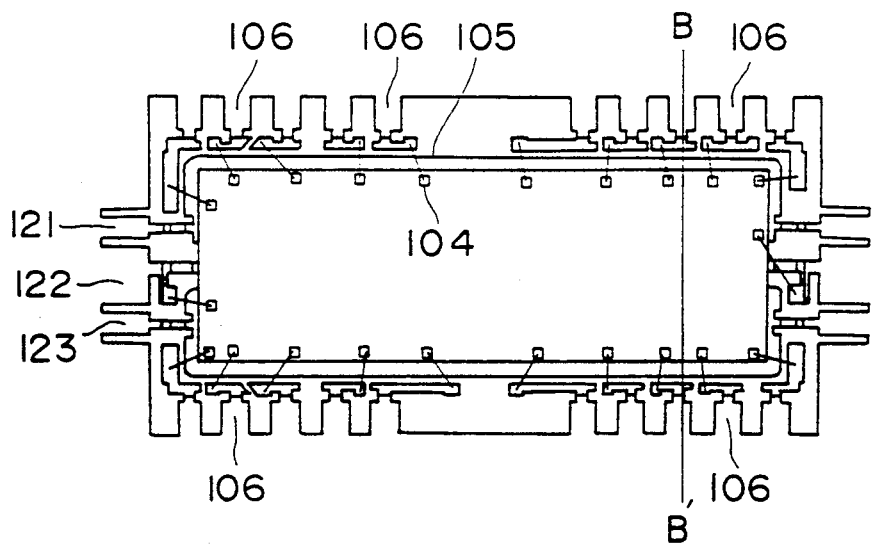
FIG. 9 is a plan view of another embodiment of the semiconductor device of this invention.
Figure 10:
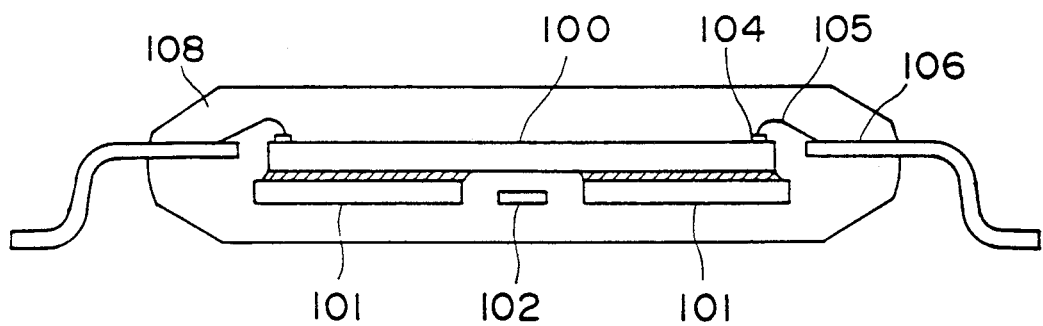
FIG. 10 is a sectional view showing section B-B' of FIG. 9.
Figure 11:
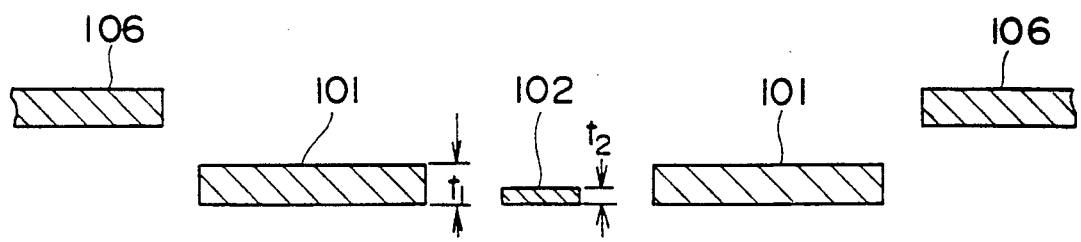
FIG. 11 is a sectional view showing the construction of the lead frame.

FIG. 9 thru FIG. 11 show another embodiment of the semiconductor device of this invention. FIG. 9 is a plan view and FIG. 10 is a sectional view showing section B-B' of FIG. 9. FIG. 11 is a sectional view showing the lead frame corresponding to section B-B' of FIG. 9. In the following explanation, parts that correspond to parts shown in FIG. 1 thru FIG. 3 will have the same reference numbers and a detailed explanation of them will be omitted.

In this embodiment, as shown in FIG. 11, the thickness t2 of the sub-element lead 102 is thinner than the thickness t1 of the support sections 101. These are depressed so that the bottom surfaces thereof are flush with each other and so, as shown in FIG. 10, a gap is produced between the top surface of the sub-element lead 102 and the bottom surface of the semiconductor chip 100 and they are sufficiently insulated by forcing molding plastic into the gap.

In this embodiment, because the sub-element lead 102 does not go below the support sections 101, as in the embodiment shown in FIG. 5C, a thin package desired for in recent years is possible.

To make the thickness t2 of the sub-element lead 102 thinner than the thickness t1 of the support sections 101, halfway etching can be performed after depressing only the sub-element lead 102.

Figure 12:
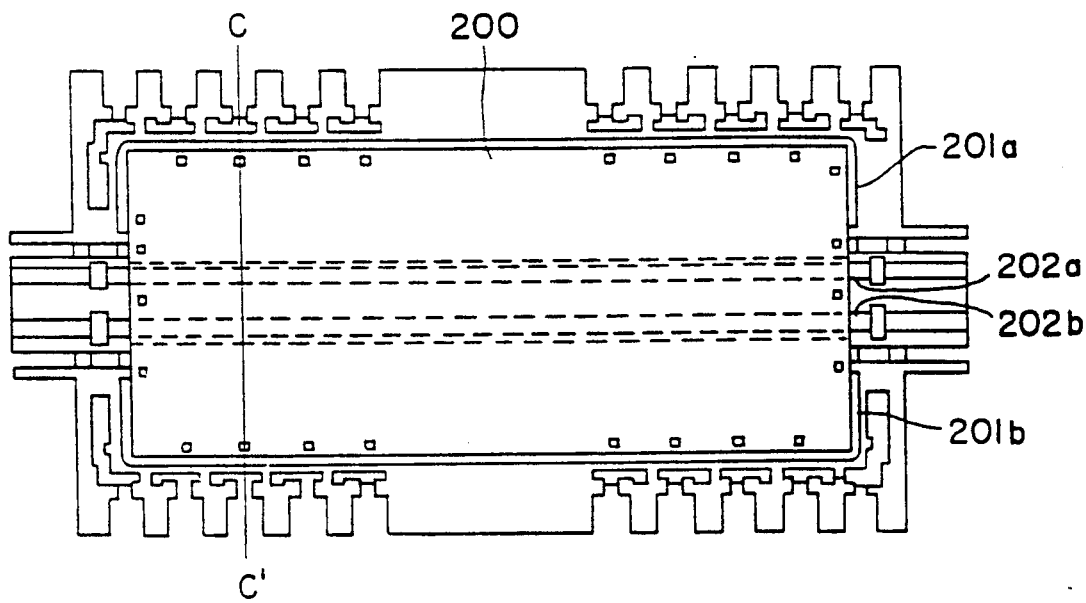
FIG. 12 is a plan view showing the lead frame used in the semiconductor device of this invention.
Figure 13A:
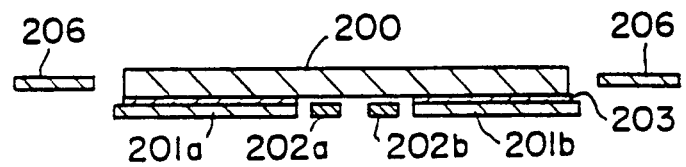
FIG. 13A thru 13D are sectional views showing section C-C' of FIG. 12.
Figure 13B:
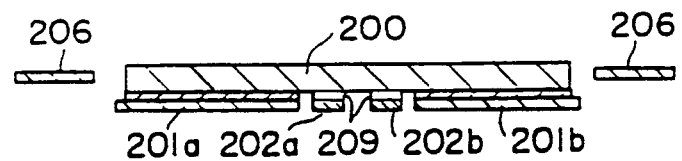
Figure 13C:
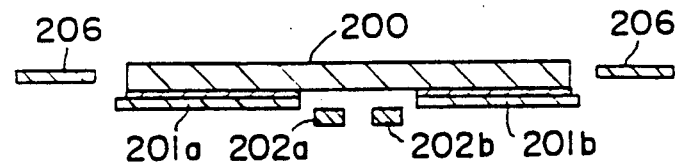
Figure 13D:
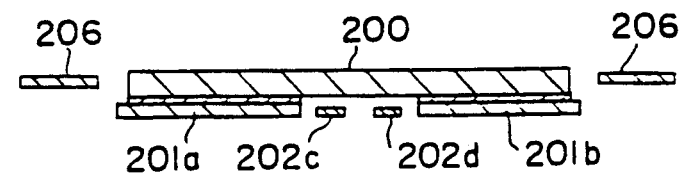

FIG. 12 is a plan view of further type of a lead frame used in this invention, and FIGS. 13A thru 13D are sectional views showing another embodiment of the present invention.

In this embodiment, two sub-element interconnecting members 202a and 202b are provided between the two support members 201a and 201b.

FIGS. 13A thru 13D are sectional diagrams along the line C-C' of FIG. 12. For the relation between support members and sub-element interconnecting members, FIG. 13A corresponds to the embodiments shown in FIGS. 3A and 5A, FIG. 13B corresponds to the embodiments shown in FIGS. 3B and 5B, FIG. 13C corresponds to the embodiments shown in FIGS. 3C and 5C and FIG. 13D corresponds to the embodiment shown in FIG. 11.

In these embodiments, since two sub-element interconnecting members are provided, not only interconnections related power supply but also those related signals can also be easily performed.

Figure 14:
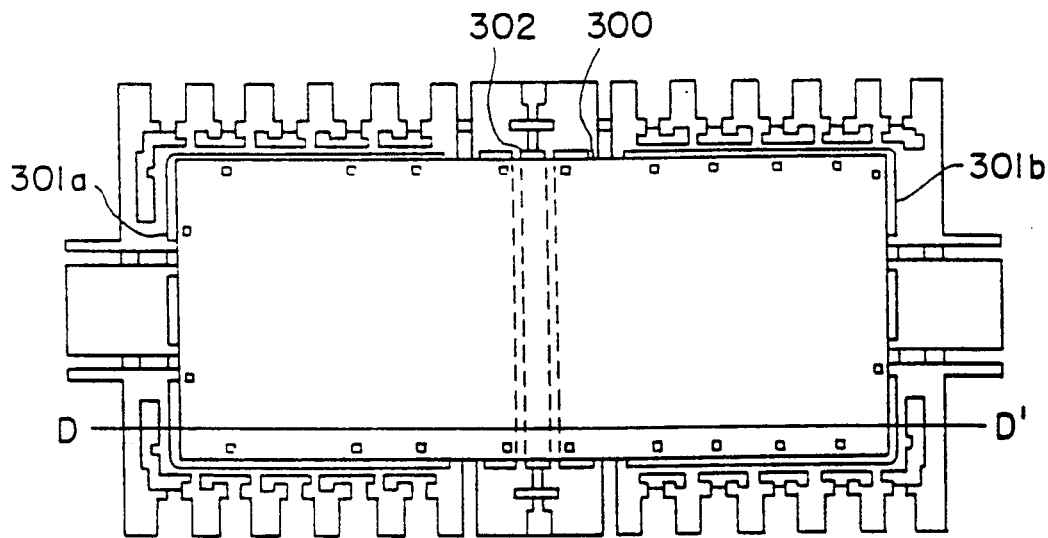
FIG. 14 is a plan view showing the lead frame used in the semiconductor device of this invention.
Figure 15A:
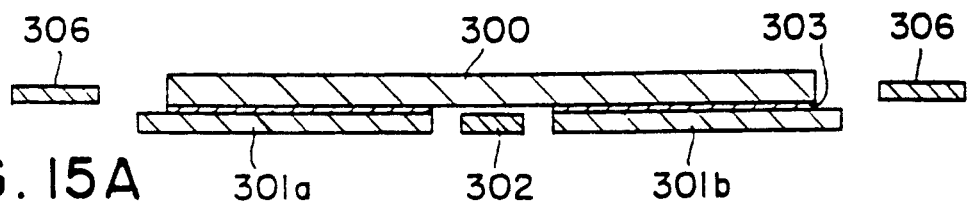
FIG. 15A thru 15D are sectional views showing section D-D' of FIG. 14.
Figure 15B:
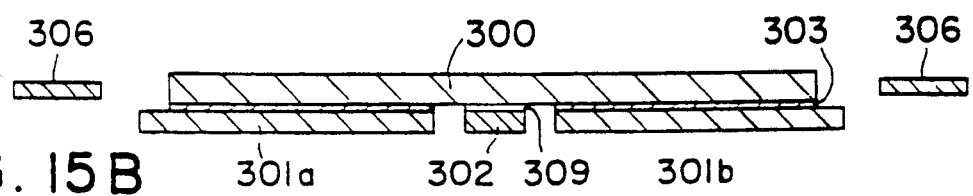
Figure 15C:
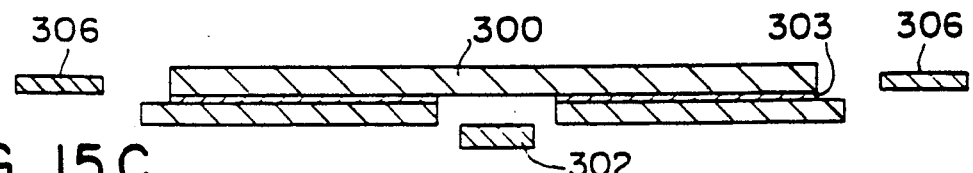
Figure 15D:
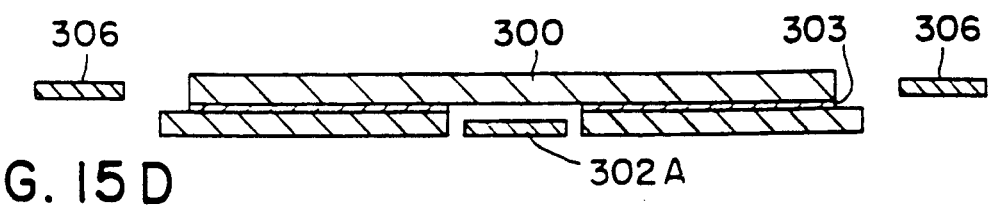
Figure 16:
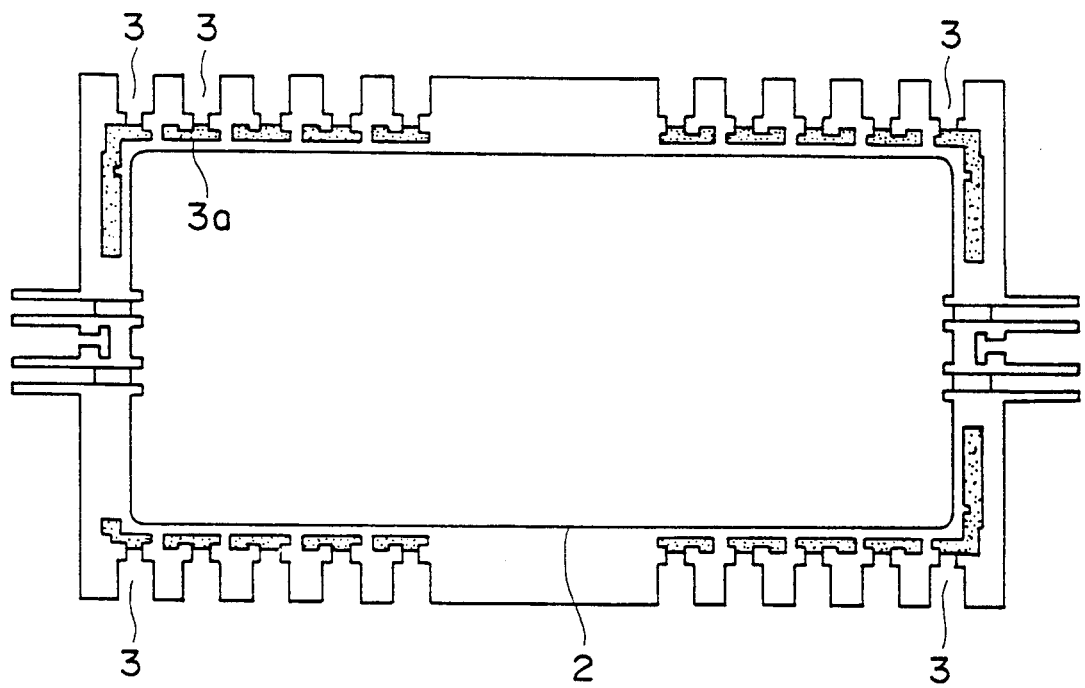
FIG. 16 is a plan view of an example of the generally known prior plastic mold type semiconductor device; it is the lead frame for a SOJ type semiconductor device.
Figure 17:
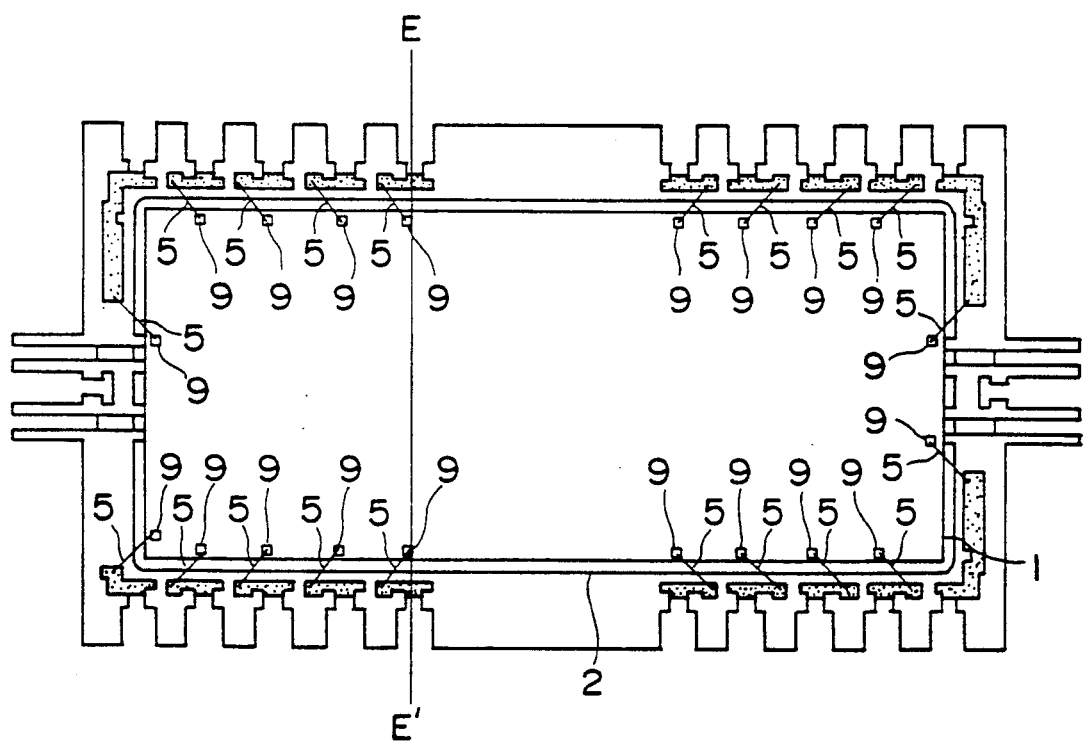
FIG. 17 is a plan view showing the lead frame of FIG. 16 with the semiconductor chip now in place.
Figure 18:
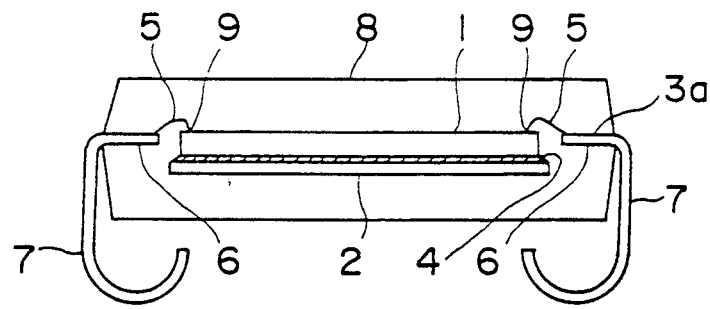
FIG. 18 is a sectional view showing section E-E' of FIG. 17.
Figure 19:
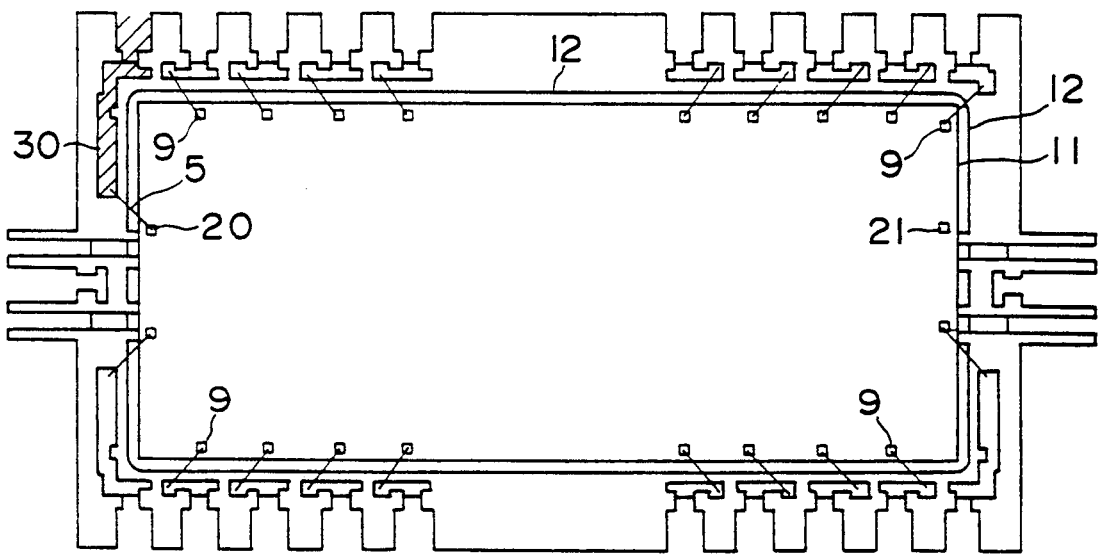
FIG. 19 is a plan view showing a prior semiconductor device with increased electrodes for power supply.
Figure 20:
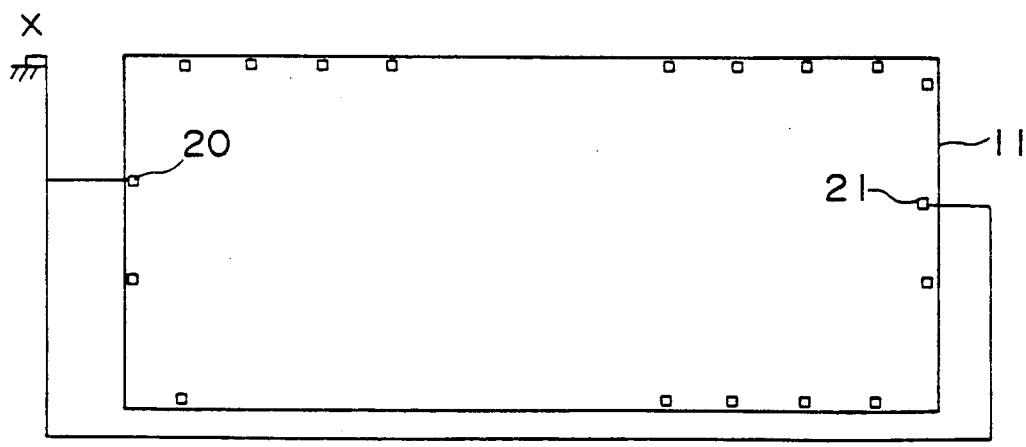
FIG. 20 shows the film of FIG. 19 with the power supply.
Figure 21:
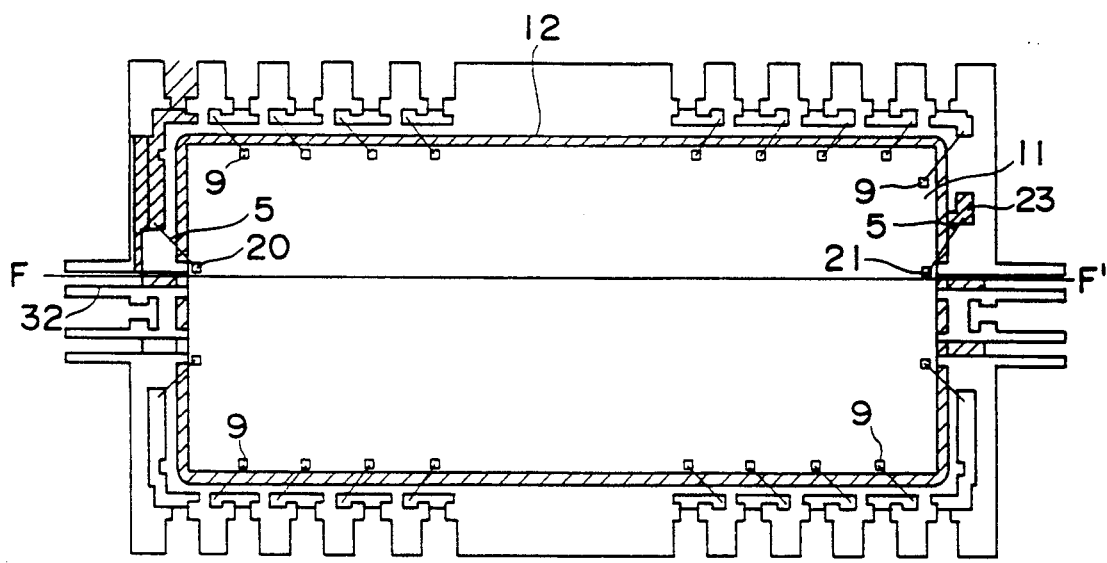
FIG. 21 shows a plan view of an example of three-dimensional power supply wiring.
Figure 22:
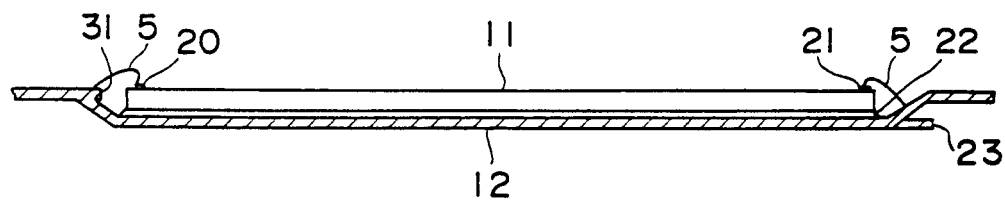
FIG. 22 is a sectional view showing section B-B' of FIG. 21.
Figure 23:
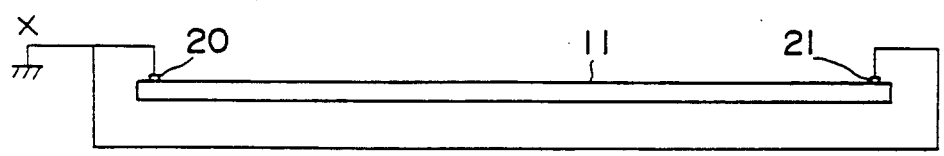
FIG. 23 shows the film of FIG. 22 with three-dimensional wiring.

FIG. 14 is a plan view of still further type of a lead frame used in this invention, and FIGS. 15A thru 15D are sectional views showing another embodiment of the present invention.

In this embodiment, a sub-element interconnecting member 302 is provided between the two support members 301a and 301b, but running direction of the interconnecting member 302 is perpendicular to those of other embodiments.

FIGS. 15A thru 15D are sectional diagrams along the line D-D' of FIG. 14. For the relation between support members and sub-element interconnection members, FIG. 15A corresponds to the embodiments shown in FIGS. 3A and 5A, FIG. 15B corresponds to the embodiments shown in FIGS. 3B and 5B, FIG. 15C corresponds to the embodiments shown in FIGS. 3C and 5C and FIG. 15D corresponds to the embodiment shown in FIG. 11.

This embodiment is especially suitable for interconnection related to signals.

In the above embodiments, there were two semiconductor support sections and one sub-element lead, however it is not limited to this, the number used can be selected depending on locations and number of the pads to be provided with equal potential.

As was described above, this invention provides a plastic mold type semiconductor device comprising a lead running underneath the semiconductor chip which divides the lead frame and makes up the sub-element interconnecting member. This lead can be used to supply or signal voltage potential or signal from the voltage potential supply or signal lead to the separated pad and makes it possible to reduces the size of the device, if the wiring rule is size reduction. In so doing, the device size can be reduced without increasing the resistance of power related wiring and without generating noise making it possible for a high operating speed. Also, the sub-element interconnecting member and the semiconductor chip can be stably insulated making it possible for a more stable and low cost manufacturing process.

Also an insulator is located between the sub-element interconnecting section and the semiconductor chip, or by depressing the sub-element interconnecting section more than the support sections they will be insulated even more.

Furthermore, if the thickness of the sub-element wiring section is thinner than the thickness of the supporting sections, it will not project lower than the support sections and insulation with the semiconductor chip is certain.

What is claimed is:

1. A plastic mold semiconductor device comprising:
a semiconductor chip having a plurality of electrodes on top thereof;
a die pad which is made of a thin metallic plate;
a plurality of leads disposed surrounding said die pad;
a plurality of wires for connecting said electrodes on top of said semiconductor chip and said leads; and
a plastic mold body which seals the entire device;
said die pad being comprised of a plurality of support members for supporting said semiconductor chip and a sub-element interconnecting member disposed between the support members and being separated by a fixed gap from the sub-element interconnecting member, said gap being adapted to receiving plastic resin to insulate said sub-element interconnecting member from the semiconductor chip, and
a connection between a power source or a signal related lead of said leads and one of said electrodes which is on top of said semiconductor chip and is located apart form the power source or signal related lead on the semiconductor chip being performed by said sub-element interconnecting member.

2. A plastic mold semiconductor device comprising:
a semiconductor chip having a plurality of electrodes on top thereof;
a die pad which is made of a thin metallic plate;
a plurality of leads disposed surrounding said die pad;
a plurality of wires for connecting said electrodes on top of said semiconductor chip and said leads; and
a plastic mold body which seals the entire device;
said die pad being comprised of a plurality of support members for supporting said semiconductor chip and a sub-element interconnecting member disposed between the support members, said support members being separated by a fixed gap from the sub-element interconnecting member, said gap being adapted for receiving plastic resin to insulate said sub-element interconnecting member from the semiconductor chip,
a connection between a power source or a signal related lead of said leads and one of said electrodes which is on top of said semiconductor chip and is located apart from the power source or signal related lead on the semiconductor chip being performed by said sub-element interconnecting member, and
said sub-element interconnecting member having a thickness which is thinner than a thickness of said support members and having a bottom surface, said support members having bottom surfaces which are at the same level as said bottom surface of said sub-element interconnecting member.

* * * * *